(12) United States Patent
Hong et al.

(10) Patent No.: US 7,129,162 B2
(45) Date of Patent: Oct. 31, 2006

(54) DUAL CAP LAYER IN DAMASCENE INTERCONNECTION PROCESSES

(75) Inventors: Hyesook Hong, Richardson, TX (US); Guoqiang Xing, Shanghai (CN); Ping Jiang, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 182 days.

(21) Appl. No.: 10/429,119

(22) Filed: May 2, 2003

(65) Prior Publication Data

US 2004/0127016 A1 Jul. 1, 2004

Related U.S. Application Data

(60) Provisional application No. 60/437,080, filed on Dec. 30, 2002.

(51) Int. Cl.
*H01L 21/4763* (2006.01)
(52) U.S. Cl. ........................ 438/637; 438/689
(58) Field of Classification Search .............. 438/637
See application file for complete search history.

(56) References Cited

U.S. PATENT DOCUMENTS

| | | | |
|---|---|---|---|
| 5,989,954 A * | 11/1999 | Lee et al. .................... 438/253 |
| 6,127,258 A | 10/2000 | Watanabe et al. | |
| 6,331,479 B1 * | 12/2001 | Li et al. ...................... 438/618 |
| 6,410,426 B1 | 6/2002 | Xing et al. | |
| 6,424,044 B1 | 7/2002 | Han et al. | |
| 6,465,340 B1 | 10/2002 | Wang et al. | |
| 6,472,333 B1 | 10/2002 | Xia et al. | |
| 6,475,810 B1 * | 11/2002 | Zhou et al. .................. 438/633 |
| 6,495,448 B1 * | 12/2002 | Lee .............................. 438/624 |
| 6,664,177 B1 * | 12/2003 | Lin et al. ..................... 438/624 |

* cited by examiner

*Primary Examiner*—Thao P. Le
(74) *Attorney, Agent, or Firm*—Jacqueline J. Garner; W. James Brady, III; Frederick J. Telecky, Jr.

(57) ABSTRACT

Damascene methods for forming copper conductors (30, 130) are disclosed. According to the disclosed method, a dual cap layer (18, 20; 122, 124) is formed over an organosilicate glass insulating layer (16; 116, 120) prior to the etching of a via or trench toward an underlying conductor (12; 112). The dual cap layer includes a layer of silicon carbide (18; 124) and a layer of silicon nitride (20; 122). The silicon carbide layer (18; 124) and silicon nitride layer (20; 122) can be deposited in either order relative to one another. The silicon carbide layer (18; 124) maintains the critical dimension of the via or trench as it is etched through the insulating layer (16; 116, 120), while the silicon nitride layer (20; 122) inhibits the failure mechanism of resist poisoning. The method is applicable to single damascene processes, but may also be used in dual damascene copper processes.

25 Claims, 9 Drawing Sheets

DUAL CAP LAYER IN DAMASCENE INTERCONNECTION PROCESSES

CROSS-REFERENCE TO RELATED APPLICATIONS

This application claims priority, under 35 U.S.C. §119(e), of Provisional Application No. 60/437,080, filed Dec. 30, 2002.

STATEMENT REGARDING FEDERALLY SPONSORED RESEARCH OR DEVELOPMENT

Not applicable.

BACKGROUND OF THE INVENTION

This invention is in the field of semiconductor integrated circuit manufacturing, and is more specifically directed to the fabrication of metallization conductor layers according to damascene processes.

In the field of integrated circuit manufacturing, a fundamental goal is to design and manufacture integrated circuits that are as small as possible. As is well known in this art, the manufacturing cost of an integrated circuit corresponds strongly to the wafer area occupied by each integrated circuit die or chip. This is because the chip area correlates directly to the number of possible integrated circuits per manufactured wafer, and because the theoretical yield, for a given manufacturing defect density, increases as chip area decreases. In addition, the smaller feature sizes that result in decreasing chip area provide improved device performance and increased functionality per unit area.

An important advance that has reduced the necessary chip area for modern integrated circuits is the technology for forming multiple levels of metal conductors. Increases in the number of available metal levels has provided dramatic reduction in chip area and increased device and functionality density.

Of course, the implementation of multiple metal levels presents many challenges and tradeoffs. The cross-sectional area of each metal conductor is preferably minimized, especially in the lower levels, to permit overlying levels to make connections to lower metal levels and to underlying active devices. These narrower-pitch metal lines require high resolution photolithography. In addition, because current density increases with decreasing conductor cross-sectional area, the vulnerability of the finished conductors to electromigration is increased for these narrow pitch conductors. Another rule pertains to the aspect (height-to-width) ratio between metal layers. These factors affect the selection of materials and fabrication methods for modern integrated circuit metallization.

Copper has become a popular metallization material in modern integrated circuits, replacing aluminum in many instances. Copper is significantly more conductive than aluminum, and is also less vulnerable to electromigration failure than aluminum. In modern processes, because of the difficulty of chemically etching copper metal, damascene processes are often used to form multiple levels of copper conductors. In general, damascene processes refer to the inlaying of a metal into etched grooves or trenches that define the conductor lines. In contrast, traditional metallization is formed by the depositing of a metal layer over insulating films on the wafer surface, followed by patterned etching of the metal film to define the conductors.

According to conventional "single damascene" processes, vias are etched through an interlevel insulating film at locations at which the conductor is to contact underlying elements, which may be portions of active semiconductor devices or metal conductors in previous levels. The vias are then filled with metal, such as copper, typically by electrochemical deposition (e.g., electroplating). Another conductive material, such as tungsten or aluminum, may also be used to fill the vias. Chemical-mechanical polishing (CMP) is then performed to remove excess copper (or other conductive material) from the surface of the insulator, leaving the conductor inlaid within the vias. An intrametal insulator layer is then deposited over the structure, and trenches are etched through the intrametal insulator layer at those locations at which the conductors are to run laterally along the surface of the device. The trenches are generally etched to expose the top of the filled vias to allow contact to the underlying elements through the vias. Copper metal is then deposited overall, again typically by electroplating. After deposition, the copper is planarized (e.g., by CMP) to leave the conductors in this level inlaid into the intrametal insulating film. The via and trench damascene process may be repeated for additional metal levels in the integrated circuit structure, with as many as eight levels being formed in modern manufacturing processes.

Dual damascene copper metal processes refer to metallization systems in which both the trenches and vias are simultaneously filled with the copper metallization. "Trench first" dual damascene processes refer to those processes in which trenches are etched into the insulator before the vias are etched, while "via first" processes define and etch the vias prior to trench etch. In either case, copper metal is simultaneously deposited into the trenches and vias, typically by electrochemical deposition (e.g., electroplating). The damascene inlay is then completed by CMP of the structure.

In both single and dual damascene processes, the use of a cap layer to overlie the insulating layers is known. These cap layers serve to protect the surface of the insulating layer during via and trench etches. This protection is especially important in those processes in which the interlevel and intrametal insulating layers are formed of low dielectric constant materials, such as organosilicate glass (OSG). In this case, the cap layer remains in place under the patterned photoresist, and protects the OSG film from punchthrough by the etch if the photoresist is partially or fully eroded during the etch, or during subsequent etches such as those used to clear etch-stop layers at via bottoms. This cap layer is also referred to as a hardmask layer, considering that the layer assists in defining the locations of trenches and vias.

By way of further background, silicon nitride is a known cap layer material in damascene processes. Examples of silicon nitride cap layers at various stages of damascene processes are described in U.S. Pat. No. 6,424,044, U.S. Pat. No. 6,127,258, and U.S. Pat. No. 6,465,340.

Figure 1A:
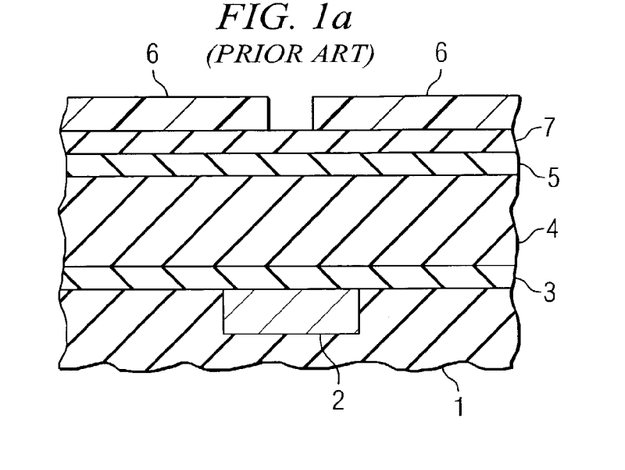
FIGS. 1a through 1c are cross-sectional views of a partially formed integrated circuit, illustrating the results of a conventional via formation process.
Figure 1B:
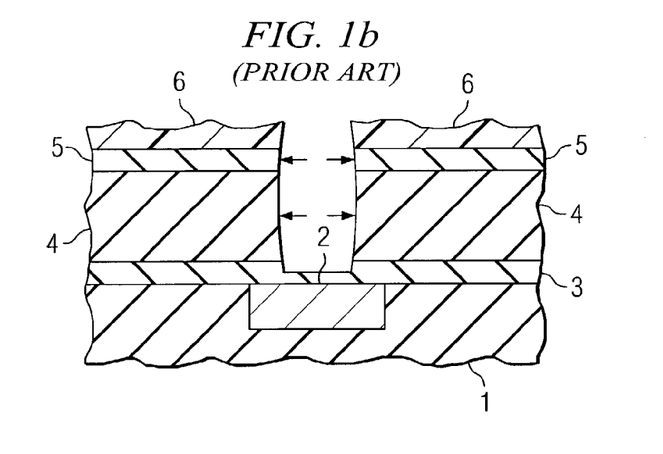
Figure 1C:
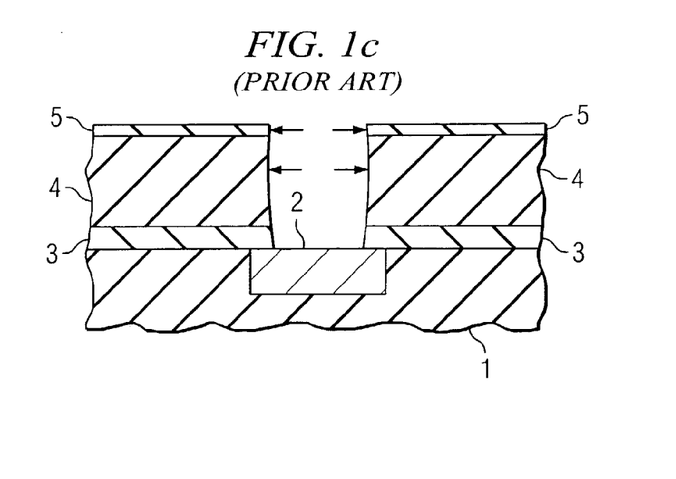

It has been observed, in connection with this invention, that the use of a silicon nitride cap layer is less than optimal in modern damascene processes, especially in defining extremely small vias. FIGS. 1a through 1c illustrate an example of a conventional via etch, as used in connection with a conventional damascene metal process. In this example, referring first to FIG. 1a, underlying conductor 2 is disposed within an insulating layer 1; for example, conductor 2 may be a copper conductor in a lower damascene metal level, or alternatively may be a semiconductor element such as a diffused region or a transistor gate. In any event, active semiconductor elements, such as transistors and passive components, are present within or beneath insulating layer 1, in the conventional manner. Etch-stop layer 3, typically formed of silicon carbide, is disposed over conductor 2, and low dielectric constant ("low-k", or "ultra-low-k") insulator layer 4 is disposed over etch-stop layer 3. In modern processes, insulator layer 4 is often formed of an OSG material, examples of which include BLACK DIAMOND silicon oxide-based CVD low-k film available from Applied Materials, Inc.; CORAL low-k dielectric film available from Novellus Systems Inc.; and SiLK dielectric material available from Dow Chemical Co. Examples of ultra-low-k materials include ORION 2.2 ultra-low-k dielectric material available from Trikon Technologies, Inc.; BLACK DIAMOND 2 insulator material available from Applied Materials, Inc.; p-SiLK dielectric material available from Dow Chemical Co.; and LKD-5109 low-k dielectric material available from JSR Corporation. Typically, insulator layer 4 is deposited using CVD techniques, although spin-on techniques may also be used. Silicon nitride cap layer 5 overlies insulator layer 4, as shown in FIG. 1a. The photolithographic patterning of the location of a via to be etched through insulator layer 4 is defined by patterned photoresist 6, which is photolithographically exposed and developed in the conventional manner, in combination with bottom anti-reflective coating (BARC) layer 7, which is disposed under photoresist 6 as shown.

FIG. 1b illustrates the structure of FIG. 1a, following a conventional via etch through low-k insulating layer 4, using photoresist 6 as a mask. This etch is a conventional plasma etch, with active species selected according to the material of insulating layer 4, as known in the art. Residue 6' remains at the surface, and consists of remaining portions of photoresist 6 and BARC layer 7. Following this etch process, etch-stop layer 3 is exposed at the bottom of the via. Because the material of etch-stop layer 3 (e.g., silicon carbide) is resistant to the via etch, it remains substantially intact at this point. However, as evident from FIG. 1a, silicon nitride cap layer 5 is not completely impervious to the via etch. Rather, cap layer 5 may be etched, or eroded, in a lateral direction due to its lower etch resistance; as a result, the via critical dimension (CD) will widen (increase). This undesirable widening of the via through insulating layer 4 continues with the clearing of etch-stop layer 3 from the bottom of the via; despite the selection of an etchant species and condition that is suitable for etching etch-stop layer 3, silicon nitride cap layer 5 will be further laterally etched, so that it and the underlying portions of insulating layer 4 that are exposed after cap layer 5 pulls back are both etched. The resulting via in FIG. 1c is thus significantly wider than the via dimensions defined by the patterning of photoresist 6 (FIG. 1a). By way of example, this CD increase may be as much as on the order of 30 nm in via width, for a via having a desired width of 140 nm, resulting in a CD increase of on the order of 20%.

This widening of the via dimensions is typically referred to as CD increase, referring to an increase of the critical dimension of the via width. In modern processes, via width is a critical dimension, particularly in repetitive structures such as memory arrays, because the size and spacing of the etched vias largely determine the density of the conductors in the current metal level, and may indirectly also define the density of the underlying structures 2.

However, because the via width is a critical dimension that defines the overall density of conductors and contacts in a given level, the photolithography process used in defining via locations is likely to be pushed to its manufacturable limits. For example, in modern processes, so-called "193 nm" photolithography, using exposure wavelengths at least as short as 193 nm, are used to define via locations. Because the via photolithography process is already at its limits, especially at 193 nm or lower wavelengths, the via pattern cannot be adjusted by undersizing the vias further, to account for the CD increase, during via etch and etch-stop layer etch, using the silicon nitride cap layer. Rather, the integrated circuit design rules must be loosened to allow for the widened vias.

By way of further background, silicon carbide is also a known material for use as the cap layer in damascene processes. An example of this use of a silicon carbide cap layer is described in U.S. Pat. No. 6,472,333. Referring to FIG. 1a, according to this conventional approach, silicon carbide would serve as cap layer 5.

However, it has been observed, in connection with this invention, that the via etch process using silicon carbide as a cap layer is vulnerable to the failure mechanism that is commonly referred to as "resist poisoning". Low-k and ultra-low-k films, such as insulating film 4 in FIG. 1a, are relatively porous materials. Nitrogen-containing materials are typically used in preceding processes, including CMP and surface pretreatment prior to etch-stop layer deposition. This nitrogen, either as an amine or in the form of ammonia, tends to be trapped in residue from the CMP process. These contaminants infiltrate the OSG film and remain within the pores. The slurry used in CMP is especially likely to provide this infiltrating nitrogen, in the form of ammonia or amine. Once the nitrogen contaminant is present in insulating film 4, it has a tendency to outgas from the film in later processes, such as trench or via pattern in a single damascene copper metal process. The deleterious effect of the nitrogen is often seen in photolithography operations that use chemically-amplified positive photoresists, such as is common in the 193 nm photoresists used for critical dimension patterns. Chemically-amplified photoresists, as known in the art, rely upon a photo-acid-based chemical reaction to transfer the exposure pattern through the complete depth of the photoresist layer, from the surface locations that were exposed to the UV light energy. However, at those locations at which nitrogen has outgassed, the acid-based reaction will stop upon reaching the basic (i.e., the amine) contaminant. This incomplete exposure of the photoresist layer at these locations, which will be at the vias in via patterning, will cause a killing physical defect, namely a missing via. It has been observed, in connection with this invention, that silicon carbide is a poor barrier to the outgassed nitrogen or ammonia, leaving the via process vulnerable to this failure mechanism.

BRIEF SUMMARY OF THE INVENTION

It is therefore an object of this invention to provide a method of forming damascene metal conductor layers in an integrated circuit in which high-precision contact vias can be reliably formed.

It is a further object of this invention to provide such a method in which the photolithography of the vias is optimized, with minimum CD increase.

It is a further object of this invention to provide such a method in which yield loss due to resist poisoning is reduced, while still providing optimum via patterning.

Other objects and advantages of this invention will be apparent to those of ordinary skill in the art having reference to the following specification together with its drawings.

The present invention may be implemented in either a single or dual damascene metal process, by forming a dual cap layer over the insulating film or films through which the contact vias are formed. The dual cap layer includes a layer of silicon carbide and a layer of silicon nitride. The layers are preferably deposited by CVD, and can be deposited either with the silicon carbide layer overlying the silicon nitride layer, or vice versa.

DETAILED DESCRIPTION OF THE INVENTION

The present invention will be described in connection with its preferred embodiments. Because this invention is believed to be especially beneficial in connection with damascene copper processes, these described embodiments of the invention will refer to those processes by way of example. It is contemplated, however, that those skilled in the art having reference to this specification will readily recognize that this invention may also be beneficially applied to other processes and structures. It is therefore understood that the described embodiments are provided in this specification by way of example only, and are not to be interpreted so as to unduly limit the true scope of the invention as claimed.

As mentioned above in connection with the Background of the Invention, it has been observed that the use of a silicon nitride cap layer over an organosilicate (OSG) insulating layer in a via etch process is vulnerable to critical dimension (CD) increase. Specifically, the vias tend to widen as the silicon nitride cap layer erodes during via etch and removal of the underlying etch-stop layer. This widening of the via from its patterned dimensions cannot be readily compensated by narrowing the patterned via, in typical modern multi-level metal processes, because the photolithography via process is generally at its manufacturable limits, especially when involving 193 nm photolithography. It has been observed, in connection with this invention, that silicon carbide is more impervious to the via etch conditions than is silicon nitride. As such, it is believed that the CD increase during via etch and etch-stop layer etch will be much reduced if silicon carbide were used as cap layer of an OSG insulating film in the via etch damascene process.

On the other hand, also as mentioned in the Background of the Invention, the use of a silicon carbide cap layer has been observed to render the damascene process vulnerable to the failure mechanism referred to as "resist poisoning". Resist poisoning refers to the incomplete exposure of an exposed location of chemically-amplified photoresist, caused by the outgassing of a nitrogen-bearing contaminant, such as ammonia or amine radicals, that had been absorbed by the underlying porous OSG. It has also been observed, in connection with this invention, that a silicon nitride cap layer provides a good barrier to the outgassing of nitrogen or ammonia from an underlying layer, such as OSG.

According to a first preferred embodiment of this invention, a dual cap layer is provided over an insulating layer, prior to via etch in a single damascene process. Referring now to FIGS. 2a through 2l, this first preferred embodiment of this invention will now be described in detail. In these Figures, it is to be understood that the particular film thicknesses and other dimensions are not necessarily shown to scale, it being understood that the cross-sectional views of these Figures are provided by way of explanation only. It is also contemplated that those skilled in the art will be readily able to visualize a corresponding plan view arrangement of the vias and other elements formed according to this preferred embodiment of the invention, and as such the following description is made with reference to the cross-sectional views only.

Figure 2A:
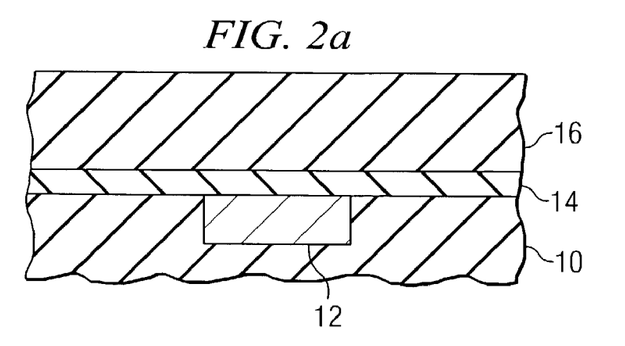
FIGS. 2a through 2l are cross-sectional views illustrating the formation of a single damascene metal level according to the first preferred embodiment of the invention.

In the cross-sectional view of FIG. 2a, an instance of conductor 12 is disposed within insulator layer 10. Conductor 12 is an element to which contact is to be made by an overlying conductor, as will become apparent from this description. According to this preferred embodiment of the invention, the overlying conductor will be formed of copper, inlaid by way of a single damascene process. In this example, conductor 12 itself may be formed of copper, for example if corresponding to a conductor in a previous lower level of copper metallization that is also formed by a damascene process. An important benefit of this invention is the protection of the structure from resist poisoning that is caused by the absorption of nitrogen-bearing contaminants by organosilicate glass layers, especially in the case where the source of the contaminant is a slurry as used in the chemical mechanical polishing (CMP) of copper and insulating material in the copper damascene process. As such, this invention is especially beneficial when applied to metallization levels above the first, in which case conductor 12 is a copper conductor in the previous metallization level to that being formed. On the other hand, if the present process is forming a first damascene copper level, conductor 12 may be formed of another metal or conductive material, such as tungsten. Still further in the alternative, conductor 12 may be a semiconductor element such as a polysilicon electrode or a diffused silicon region.

In any case, insulator layer 10 is formed of a dielectric material that insulates conductor 12 from other instances of itself, and from other conductive or semiconductor elements (not shown) which underlie insulator layer 10. Preferably, insulating layer 10 is a low dielectric constant insulator, such as an organosilicate glass (OSG). Alternatively, insulating layer 10 may be a different type of low-k dielectric such as fluorine-doped silicon dioxide (also referred to as fluorinated silicate glass, or FSG), or may be an ultra-low-k material such as ORION 2.2 ultra-low-k dielectric material available from Trikon Technologies, Inc.; BLACK DIAMOND 2 insulator material available from Applied Materials, Inc.; p-SiLK dielectric material available from Dow Chemical Co.; or LKD-5109 low-k dielectric material available from JSR Corporation, or further in the alternative may simply be a film of silicon dioxide itself. It is contemplated that transistors, passive devices, and the like are in place beneath insulating layer 10, as conventional for integrated circuits. These active and passive devices are formed at a semiconducting surface of a substrate (not shown), as fundamental in the art, with the substrate providing support for the structures being formed according to this preferred embodiment of the invention, in the conventional manner. Conductors 12 are in contact with such other active and passive devices and elements underlying insulating layer 10, and as such form part of an overall integrated circuit being formed at this surface of the substrate.

As shown in FIG. 2a, etch-stop layer 14 overlies insulating layer 10 and conductor 12, and interlevel dielectric layer 16 overlies etch-stop layer 14. Etch-stop layer 14 is a relatively thin layer of a material having different etch characteristics than that of overlying interlevel dielectric layer 16. As such, the thickness and composition of via etch-stop layer 14 will depend upon the composition of interlevel dielectric layer 16. Interlevel dielectric layer 16, as indicated by its name, is primarily responsible for insulating conductors in adjacent levels from one another, thus providing isolation between such conductors in the vertical sense. According to this preferred embodiment of the invention, the material of interlevel dielectric layer 16 is a low dielectric constant ("low-k") material, preferred examples of which include organosilicate glass (OSG) such as BLACK DIAMOND silicon oxide-based CVD low-k film available from Applied Materials, Inc.; CORAL low-k dielectric film available from Novellus Systems Inc.; and SiLK dielectric material available from Dow Chemical Co. Alternatively, other low-k dielectric materials such as FSG, or ultra-low-k dielectric materials such as ORION 2.2 ultra-low-k dielectric material available from Trikon Technologies, Inc.; BLACK DIAMOND 2 insulator material available from Applied Materials, Inc.; p-SiLK dielectric material available from Dow Chemical Co.; and LKD-5109 low-k dielectric material available from JSR Corporation, or the like may serve as interlevel dielectric layer 16.

In this example, interlevel dielectric layer 16 is an OSG having a thickness on the order of 500 nm; in this case, etch-stop layer 14 is preferably silicon carbide, formed by chemical vapor deposition (CVD) to a thickness on the order of 60 nm. Of course, variations in these thicknesses, and in the materials used for interlevel dielectric layer 16 and etch-stop layer 14 may be made. It will be understood by those skilled in the art having reference to this specification that the thickness and material of interlevel dielectric layer 16 will tend to dictate the thickness and material of etch-stop layer 14.

Figure 2B:
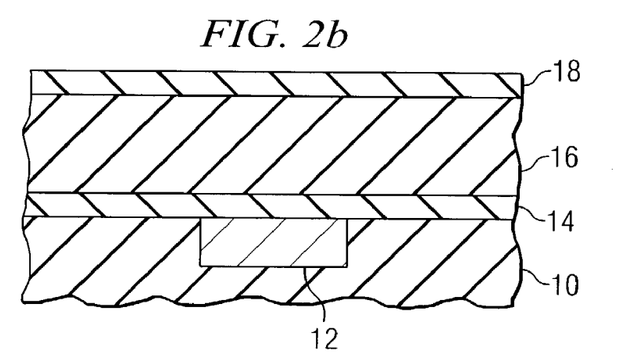

Referring now to FIG. 2b, cap layer 18 is next deposited over the surface of interlevel dielectric layer 16. According to this preferred embodiment of the invention, cap layer 18 is formed of silicon carbide (SiC), deposited by way of CVD. Any conventional CVD process for depositing SiC cap layer 18 may be used, according to this embodiment of the invention, and as such this deposition may or may not be a plasma-enhanced CVD (PECVD) process, depending upon the available equipment and the desired process. The thickness of SiC cap layer 18 will depend upon the thicknesses of the other films, and perhaps also upon the particular etch chemistries and photoresist thickness and material. According to this exemplary preferred embodiment of the invention, SiC cap layer 18 is on the order of 40 nm in thickness.

Figure 2C:
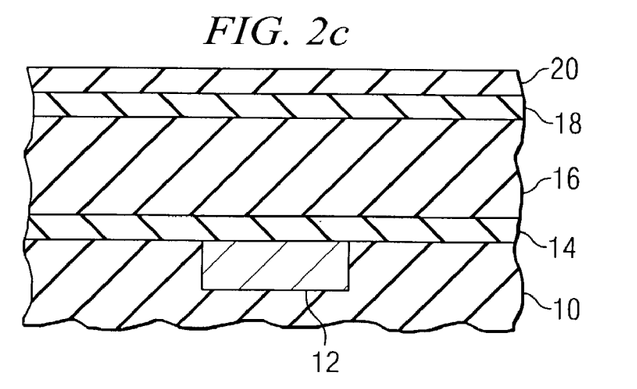

As shown in FIG. 2c, cap layer 20 is disposed over SiC cap layer 18. According to this preferred embodiment of the invention, cap layer 20 is formed of silicon nitride ($Si_3N_4$), deposited by way of CVD. According to this embodiment of the invention, any conventional CVD process, plasma-enhanced or otherwise, may be used to deposit nitride cap layer 20. It is preferred to use the same process equipment for the deposition of nitride cap layer 20 as for SiC cap layer 18, permitting the deposition of nitride cap layer 20 in situ with SiC cap layer 18. Of course, the deposition species and perhaps the process conditions will differ for the deposition of these films. The thickness of nitride cap layer 20 also depends upon the thickness of the other films, as well as the photoresist composition and thickness, and the corresponding etch chemistries. According to this example, nitride cap layer 20 is on the order of 30 nm in thickness.

Figure 2D:
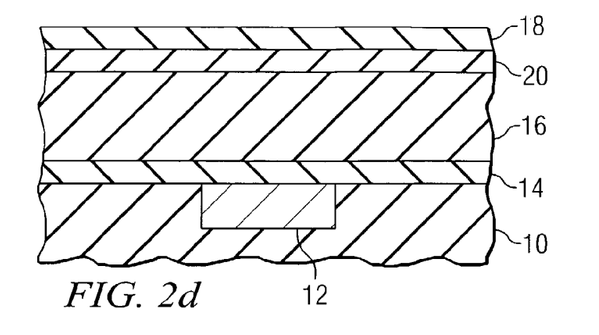

According to this preferred embodiment of the invention, the order in which SiC cap layer 18 and nitride cap layer 20 are deposited can be reversed. As shown in FIG. 2d, nitride cap layer 20 may underlie SiC cap layer 18. The particular process conditions used to deposit these layers would likely not differ, except to the extent that modifications to these process conditions may improve the in situ deposition of the two layers 18, 20.

Planarization processes, such as chemical mechanical polishing (CMP), may also be performed to planarize the surface of the structure, if desired. For example, CMP may be applied after the deposition of interlevel dielectric layer 16, prior to the deposition of cap layers 18, 20.

Optionally, a thin layer of silicon dioxide (not shown) may be formed over the top of the upper one of cap layers 18, 20. This layer of silicon dioxide, for example on the order of 5 nm in thickness serves the function of preventing photoresist footing at the nitride interface. This additional silicon dioxide layer may be omitted, or replaced by a BARC layer, if this additional function is not required.

Figure 2E:
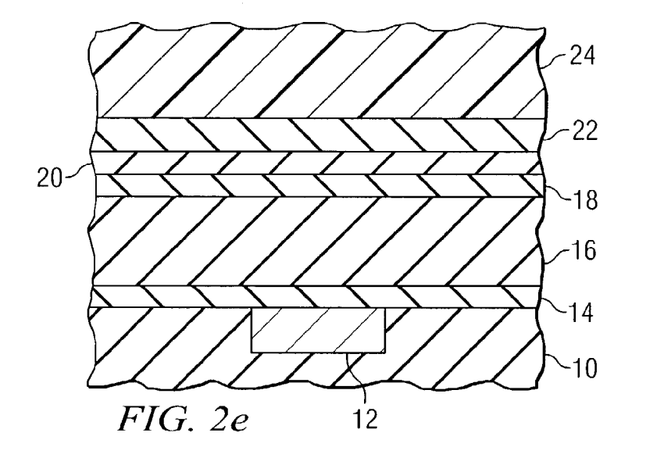

Referring now to FIG. 2e (in which SiC cap layer 18 underlies nitride cap layer 20, as in FIG. 2c), the process continues with the definition of the location of a via to be etched through interlevel dielectric layer 16 to contact conductor 12. Bottom antireflective coating (BARC) layer 22 is first formed over cap layers 18, 20. As conventional in the art, BARC layer 22 helps to eliminate photolithography artifacts such as standing wave effects, and the effects of reflective notching and thin film interference, and to improve CD uniformity across the wafer. A preferred example of the material of BARC layer 22 is AR 19 BARC material from Shipley Company L.L.C. Photoresist 24 is then dispensed, generally spun-on, over BARC layer 22. In this preferred embodiment of the invention, where vias of minimum size are to be formed through interlevel dielectric layer 16, photoresist 24 is preferably a chemically-amplified photoresist, for example exposed by light at UV wavelengths on the order of 193 nm, as known in the art for modern integrated circuit manufacturing.

Figure 2F:
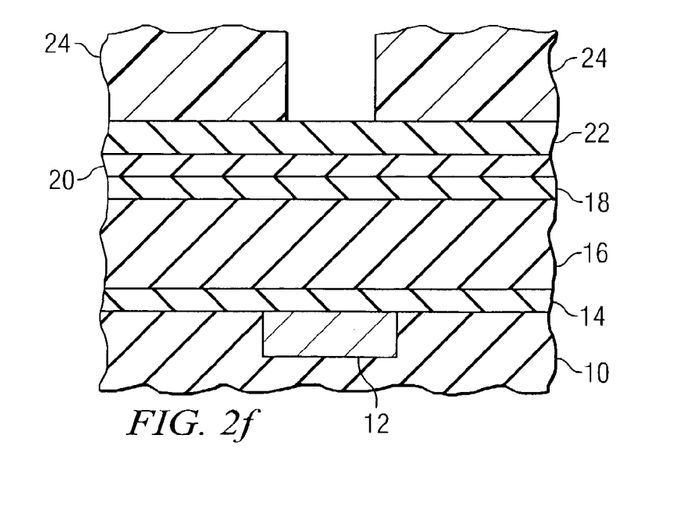
Figure 2G:
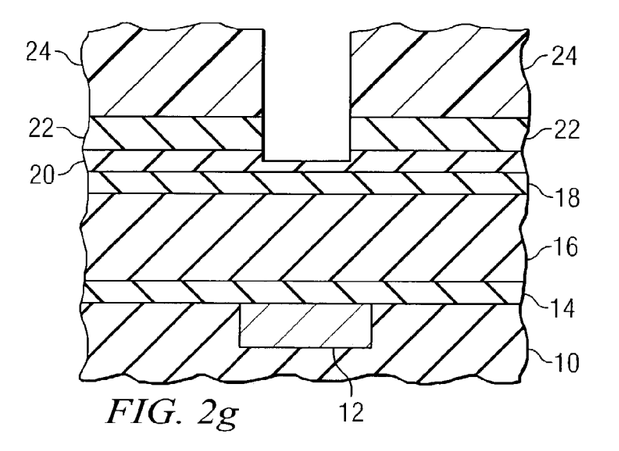

Photoresist 24 is then photolithographically patterned, for example by 6% attenuated mask exposure and developing, to define the locations at which a via is to be formed. Of course, many vias will be simultaneously defined with this photolithography operation. According to this preferred embodiment of the invention, the exposure is carried out at UV wavelengths (e.g., 193 nm), with the exposed locations defined by photomask reticles. The developing of the exposed photoresist involves, according to this exemplary embodiment, chemical amplification to transfer the exposure through the thickness of photoresist 24. The exposed and developed photoresist 24 is effectively removed from the via locations, as shown in FIG. 2f. BARC layer 22 remains at the via location.

The etching of a via through interlevel dielectric layer 16 is then performed. According to this embodiment of the invention, especially where small vias (e.g., on the order of 140 nm in diameter) are to be formed through the relatively thick interlevel dielectric layer 16 (e.g., on the order of 500 nm in thickness), the preferred etch method is a plasma etch, to provide an anisotropic etch of these films, resulting in substantially vertical sidewalls of the via openings. An example of the etch of BARC layer 22 involves a plasma etch with $CF_4$, $O_2$, and argon gases in the reaction chamber, resulting in the structure of FIG. 2g.

Figure 2H:
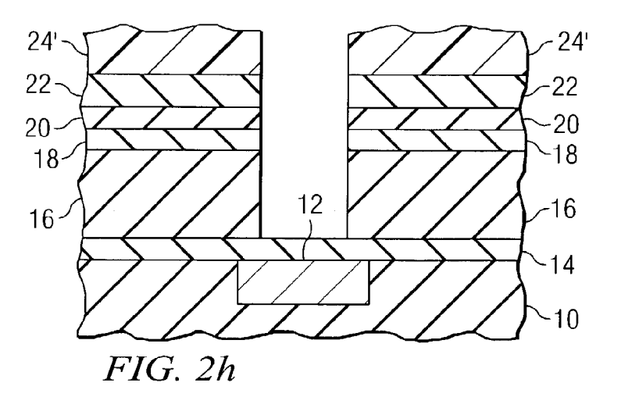

Cap layers 18, 20 are then plasma etched, at the exposed via location, with an etchant chemistry including $C_4F_8$, $O_2$, and argon, by way of example. Once these layers are etched to define the location of interlevel dielectric layer 16 at which the via is to be formed, a main plasma etch is next performed to form the via. An example of the active etchant species for the main etch includes a mixture of $C_4F_8$, CO, $N_2$, and argon. This main etch continues until about 100 to 150 nm of interlevel dielectric layer 16 remains above etch-stop layer 14, by performing a timed plasma etch. To ensure good contact resistance by ensuring that interlevel dielectric layer 16 is fully cleared from the via, a timed plasma overetch is performed after the via main etch, for example using a mixture of the active species of $C_4F_8$, $N_2$, and argon in the plasma chamber. The resulting structure is illustrated in FIG. 2h. As shown in this FIG. 2h, it is contemplated that the main etch and overetch will also tend to erode photoresist 24, leaving photoresist residue 24' as shown in FIG. 2h.

However, according to this embodiment of the invention, the use of SiC cap layer 18 serves to maintain the dimensions of the via as patterned, during the etch through interlevel dielectric layer 16. Silicon carbide is contemplated to be quite impervious to the etch of interlevel dielectric layer 16 in this example, and as such SiC cap layer 18 will not tend to erode laterally as in the case of a silicon nitride cap layer as described above. It is therefore contemplated that this embodiment of the invention provides an important benefit of maintaining via critical dimension, in this exemplary process flow.

Figure 2I:
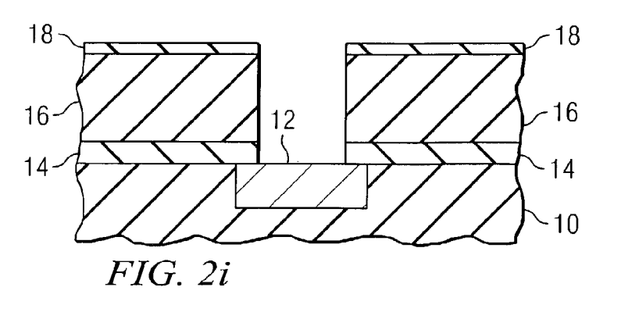

At the state of the process shown in FIG. 2h, etch-stop layer 14 remains in place at the bottom of the etched via. Photoresist residue 24 and BARC layer 22 remain to some extent over cap layers 18, 20, and are then stripped off from the structure, by a conventional plasma ash and wet cleanup. According to this preferred embodiment of the invention, etch-stop layer 14 is then plasma etched, for example with active gases including $CHF_3$, $CF_4$, Ar, and $N_2$ to etch silicon carbide etch-stop layer 14. This etch is carried out to clear, stopping on the underlying conductor 12 as shown in FIG. 2i. Remaining residues are then cleaned from the surface of the structure, in the conventional manner, such as by way of a plasma ash, wet clean, or combination thereof.

Figure 2J:
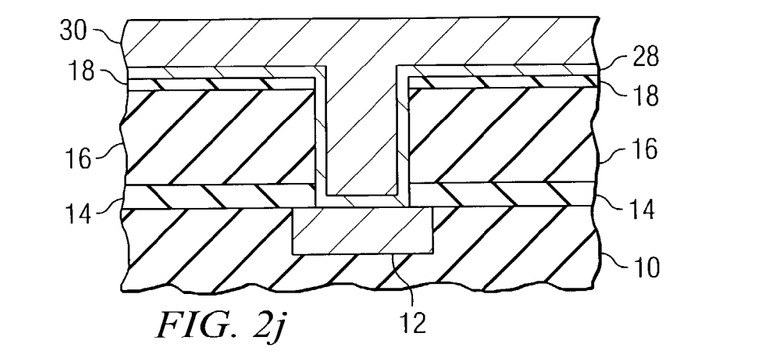

According to this single damascene copper metal process, liner layer 28 is deposited overall, to provide a diffusion barrier between the copper metallization and underlying structures, in the conventional manner. Liner layer 28 extends into the via in contact with underlying conductor 12, and also extends over the surface of any remaining portions of cap layers 18, 20 as shown in FIG. 2j. Examples of conventional materials useful for liner layer 28 include tantalum nitride and titanium nitride, although many other materials may also be used as known in the art. Copper metallization layer 30 is then deposited into the via over liner layer 28, resulting in the structure shown in FIG. 2j. While metallization layer 30 is preferably copper, other metal systems may alternatively be used. For the example of copper, the deposition of metallization layer 30 is preferably performed by electroplating. Typically, as known in the art, the overall copper electroplating process includes the physical vapor deposition (PVD) of a seed layer of copper metal. Copper is then electroplated, with copper atoms adhering to the copper seed layer to form metallization layer 30. Variations and alternatives to the copper deposition processes are well known in the art, and may be used to deposit metallization layer 30 according to this preferred embodiment of the invention. This deposition of copper continues until metallization layer 30 is sufficiently thick to fill the via, and to overlie interlevel dielectric layer 16 and any remainder of cap layers 18, 20 to a desired thickness, as shown in FIG. 2j.

To complete the damascene process, planarization of the structure is then performed to planarize metallization layer 30 flush with the surrounding dielectric films. A preferred planarization process is chemical mechanical polishing (CMP), which removes the portion of barrier layer 28 and metallization layer 30 overlying interlevel dielectric layer 16. This CMP also removes the remaining portions of cap layers 18, 20. The resulting conductors 30 are thus formed within the via in the structure, as shown in FIG. 2k.

According to this embodiment of the invention, it is preferred that cap layers 18, 20 do not remain after the CMP of copper metallization layer 30, because these layers will tend to increase the dielectric constant of the insulator layer. As such, cap layers 18, 20 are effectively sacrificial layers in the CMP process.

Figure 2K:
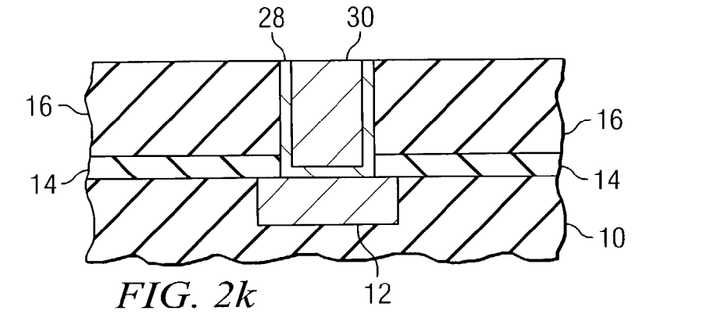
Figure 2L:
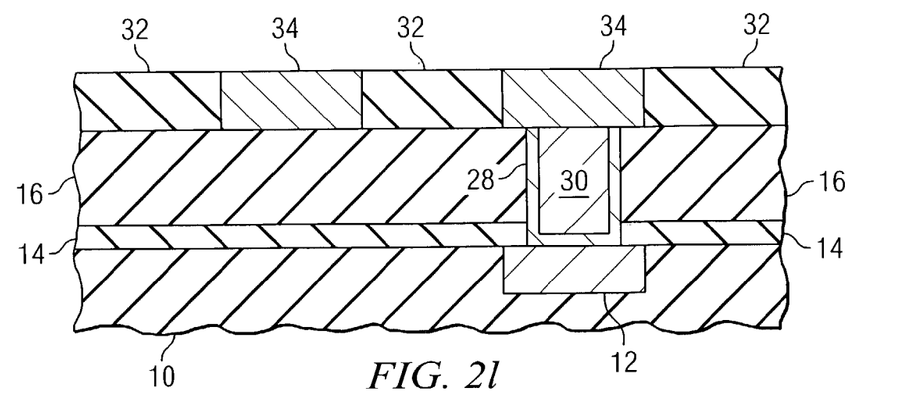

After the CMP planarization resulting in the structure of FIG. 2k, in this single damascene process example, copper metal conductors are formed to contact the via metallization 30. According to this preferred embodiment of the invention, intrametal dielectric layer 32 is first deposited over the structure, preferably of a low-k dielectric material such as an OSG, preferred examples of which include organosilicate glass (OSG) such as BLACK DIAMOND silicon oxide-based CVD low-k film available from Applied Materials, Inc.; CORAL low-k dielectric film available from Novellus Systems Inc.; and SiLK dielectric material available from Dow Chemical Co. Alternatively, an ultra-low-k dielectric material may also form intrametal dielectric layer 32, examples of which include ORION 2.2 ultra-low-k dielectric material available from Trikon Technologies, Inc.; BLACK DIAMOND 2 insulator material available from Applied Materials, Inc.; p-SiLK dielectric material available from Dow Chemical Co.; and LKD-5109 low-k dielectric material available from JSR Corporation. Another instance of silicon carbide and silicon nitride cap layers may be deposited at this point, in the manner described above, to form a dual cap layer that assists in the maintaining of CD control and inhibiting the failure mechanism of resist poisoning during trench formation. This intrametal dielectric layer 32 (and additional dual cap layer, if present) is then patterned and etched as before to define the trench locations at which the conductor is to be formed. Deposition and planarization of copper metal results in the formation of copper conductor 34 in the trench within intrametal dielectric layer 32, including in contact with conductor 30 within the via formed according to the preferred embodiment of the invention, as illustrated in FIG. 2l.

The single damascene process can then be repeated, beginning with the deposition of another etch-stop layer over conductor 34, similarly as etch-stop layer 14 relative to conductor 12. In each level, the dual cap layer of silicon carbide and silicon nitride enables the formation of narrow and high density vias without critical dimension increase, while also inhibiting the failure mechanism of resist poisoning, as described above.

Referring now to FIGS. 3a through 3h, another preferred embodiment of the invention will now be described, in connection with a via-first dual damascene process. As known in the art, many variations of the dual damascene process exist. Several of these variations involve the order in which the trenches and vias are formed, with some processes etching the full via prior to the trench (as will be described below), and others etching the trench first, or etching part of the via prior to trench etch. It is contemplated that this embodiment of the invention will be most useful in connection with a via-first dual damascene process, but those skilled in the art having reference to this specification will also recognize that this embodiment of the invention can be used to advantage in other dual damascene implementations.

Figure 3A:
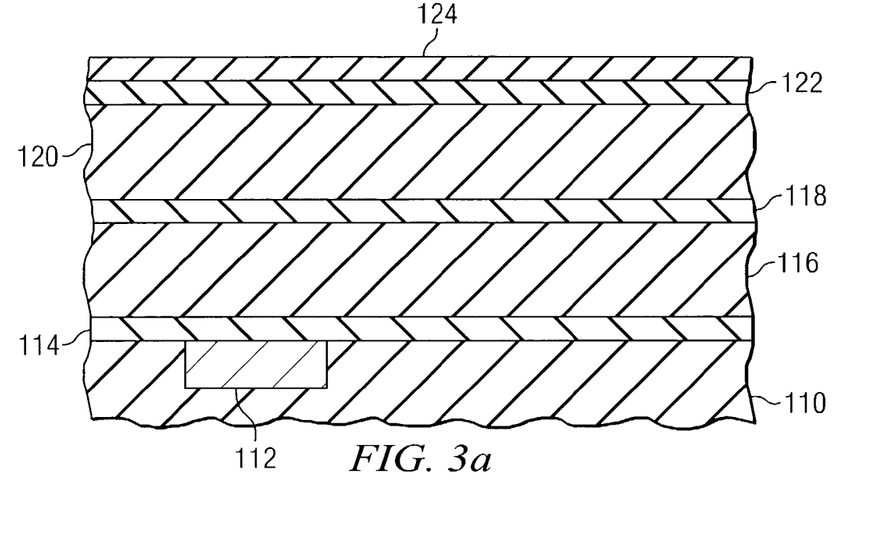
FIGS. 3a through 3h are cross-sectional views illustrating the formation of a dual damascene metal level according to a second preferred embodiment of the invention.

In the point in the process illustrated in FIG. 3a, conductor 112 is disposed within insulating layer 110. As in the previously described embodiment, conductor 112 may correspond to a copper conductor formed by a dual damascene process in a previous level, or may correspond to a different conductive or semiconductor material. Active devices such as transistors are contemplated to be present at or underlying conductor 112 and insulating layer 110, as described above. Etch-stop layer 114, for example formed of silicon carbide, is disposed over conductor 112 and insulating layer 110. Interlevel dielectric layer 116 is disposed over etch-stop layer 114, as in the previously described embodiment, and is preferably a low-k OSG dielectric material such as BLACK DIAMOND silicon oxide-based CVD low-k film available from Applied Materials, Inc.; CORAL low-k dielectric film available from Novellus Systems Inc.; and SiLK dielectric material available from Dow Chemical Co.; or an ultra-low-k material, such as ORION 2.2 ultra-low-k dielectric material available from Trikon Technologies, Inc.; BLACK DIAMOND 2 insulator material available from Applied Materials, Inc.; p-SiLK dielectric material available from Dow Chemical Co.; and LKD-5109 low-k dielectric material available from JSR Corporation, dispensed or deposited in the conventional manner. An example of the thickness of interlevel dielectric layer 116 is on the order of 500 nm. If desired, CMP may be used to planarize interlevel dielectric layer 116 after its deposition.

According to this embodiment of the invention, trench etch-stop layer 118 is disposed over interlevel dielectric layer 116, and intrametal dielectric layer 120 is disposed over trench etch-stop layer 118. Intrametal dielectric layer 120 is also preferably a low-k dielectric material, preferably the same material as used to form interlevel dielectric layer 116. The thickness of intrametal dielectric layer 120 defines the thickness of the eventual copper conductors; for example, intrametal dielectric layer 120 may be on the order of 400 to 500 nm. Trench etch-stop layer 118 is preferably formed of a material that has different etch characteristics than intrametal dielectric layer 120, so that the etchant used to etch intrametal dielectric layer 120 will not significantly etch trench etch-stop layer 118. For example, if intrametal dielectric layer 120 is formed of an OSG, trench etch-stop layer 118 can be silicon carbide, deposited by conventional CVD or PECVD, to a thickness on the order of 30 nm. Intrametal dielectric layer 120 may be deposited or dispensed by the appropriate conventional method corresponding to its composition, and may be planarized by CMP if desired.

Alternatively, intrametal dielectric layer 120 may be formed of a different material than that of interlevel dielectric layer 116, for example of a material that is etched by a specific etchant that does not significantly etch interlevel dielectric layer 116. In this case, trench etch-stop layer 118 can be omitted. In addition, trench etch-stop layer 118 can be omitted even in cases where the interlevel dielectric layer 116 and intrametal dielectric layer 120 are formed of the same material. In any event, if possible, the omission of trench etch-stop layer 118 will keep the overall dielectric constant low.

According to this preferred embodiment of the invention, a dual cap layer is provided over intrametal dielectric layer 120, to provide protection against resist poisoning while maintaining close CD tolerance during via and trench etch, as will be described below. In this example, silicon nitride cap layer 122 is disposed over intrametal dielectric layer 120, and silicon carbide (SiC) cap layer 124 is disposed over nitride cap layer 122. As before, the order in which nitride cap layer 122 and SiC cap layer 124 are disposed can be reversed, if desired. Preferably, nitride cap layer 122 and SiC cap layer 124 are deposited by conventional CVD, with or without plasma enhancement, and preferably in situ in the same processing chamber for the sake of efficiency. Each of nitride cap layer 122 and SiC cap layer 124 are deposited to a thickness corresponding to their desired functionality and to the characteristics and thickness of the photoresist layers to be used in masking the via and trench etch. For example, cap layers 122, 124 may each be 30 to 50 nm in thickness. In addition, a thin silicon dioxide layer (not shown) may be deposited on the upper one of cap layers 122, 124, as before. The resulting structure is illustrated in FIG. 3a.

Figure 3B:
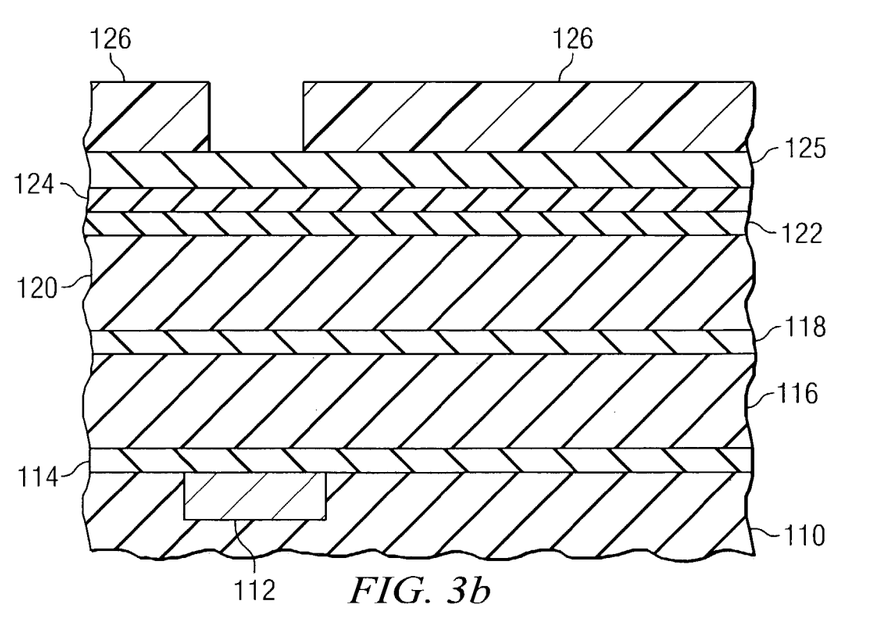

As shown in FIG. 3b, BARC layer 125 and photoresist layer 126 are dispensed or deposited, as the case may be, onto cap layers 122, 124. BARC layer 125, as before, is a conventional layer that helps to eliminate photolithography artifacts and to improve CD uniformity across the wafer. Photoresist 126 is then dispensed over BARC layer 124, generally by spinning-on. In this preferred embodiment of the invention, as before, vias of minimum size are to be formed through interlevel dielectric layer 116 and intrametal dielectric layer 120, and as such photoresist 126 is preferably a chemically-amplified 193 nm photoresist. In FIG. 3b, photoresist 126 is illustrated after photolithographic exposure and developing, to be removed from the location at which a via is to be etched, as will now be described relative to FIG. 3c.

Figure 3C:
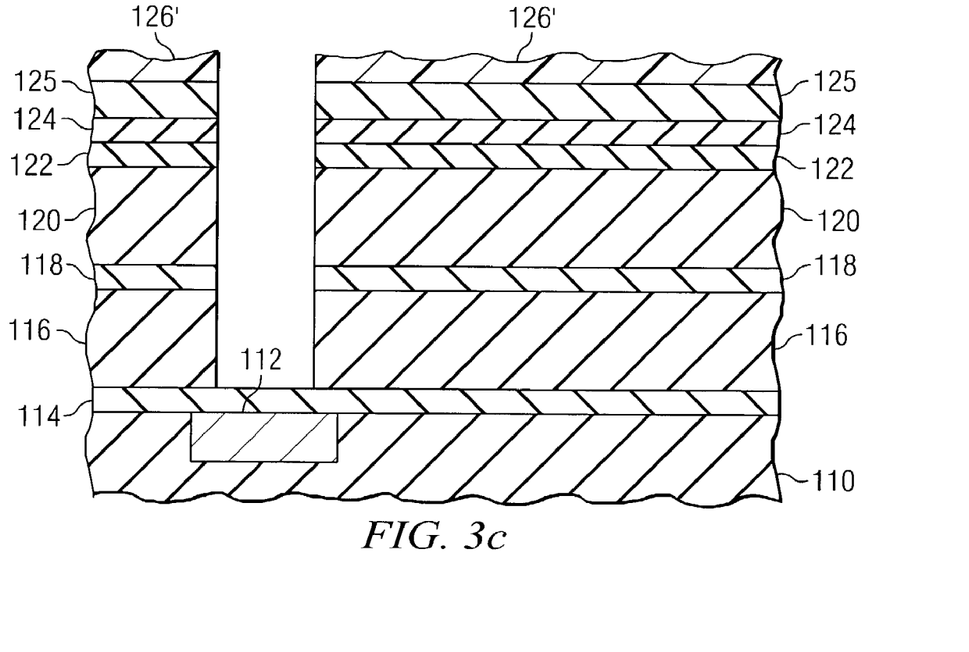

According to this embodiment of the invention, applied to an exemplary via-first dual damascene copper metallization process, a via is etched at the location defined by patterned photoresist 126, extending fully to etch-stop layer 114 as shown in FIG. 3c. Preferably, the via etch is carried out in multiple stages, in order to etch through each of BARC layer 125, SiC cap layer 124, nitride cap layer 122, intrametal dielectric film 120, trench etch-stop layer 118, and interlevel dielectric layer 116. To attain this high aspect ratio via, these etches are preferably all plasma etches, to take advantage of the anisotropy provided by such etches. The specific reagents, or active species, for the via etch through each of the levels are as conventional in the art, examples of which are described above for corresponding materials relative to the first preferred embodiment of the invention. As illustrated in FIG. 3c, this via etch is carried out until etch-stop layer 114 is reached or just short of etch-stop layer 114, followed by an overetch to ensure clearing of all vias on the integrated circuit wafer. Etch-stop layer 114 preferably remains at the bottom of the via in this embodiment of the invention, however, considering that a trench etch is yet to be performed.

According to this embodiment of the invention, nitride cap layer 122 and SiC cap layer 124 provide important benefits to the manufacture of the integrated circuit, relative to this via etch. As illustrated in FIG. 3c, photoresist layer 126 and perhaps BARC layer 125 are significantly eroded during the long and multiple-stage via etch process, for example leaving photoresist residue 126' and BARC layer 125 as shown. The dual cap layer of nitride cap layer 122 and SiC cap layer 124 provide additional protection to the underlying intrametal dielectric layer 120 in the event that these masking layers break down. Even more importantly, however, SiC cap layer 124 provides the additional protection of the via from increase of critical dimension during via etch, in the form of undesired widening of the via. In addition, to the extent that the structure is vulnerable to resist poisoning due to the outgassing of nitrogen-bearing contaminants from dielectric layers 116, 120 into photoresist 126, nitride cap layer 122 serves as a strong barrier to such outgassing. As a result, extremely small vias can be reliably etched in this dual damascene process, according to the preferred embodiment of the invention.

Figure 3D:
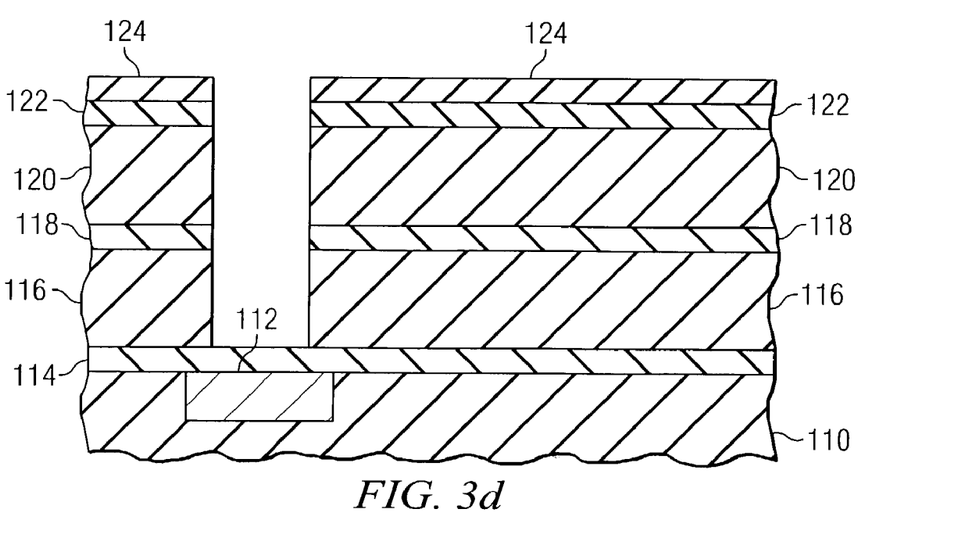

Referring now to FIG. 3d, photoresist residue 126' and BARC layer residue 125 are removed from the surface. Photolithographic patterning of the trenches in this dual damascene process is next performed, beginning with the deposition of another BARC layer 127 and the dispensing, exposure, and developing of photoresist 128, resulting in the structure as shown. In this exemplary embodiment of the invention, BARC layer 127 and photoresist 128 are deposited and dispensed over nitride cap layer 122 and SiC cap layer 124, resulting in the structure of FIG. 3e. As evident from FIG. 3e, some amount of BARC layer 127 is deposited within the via, in contact with etch-stop layer 114.

Figure 3E:
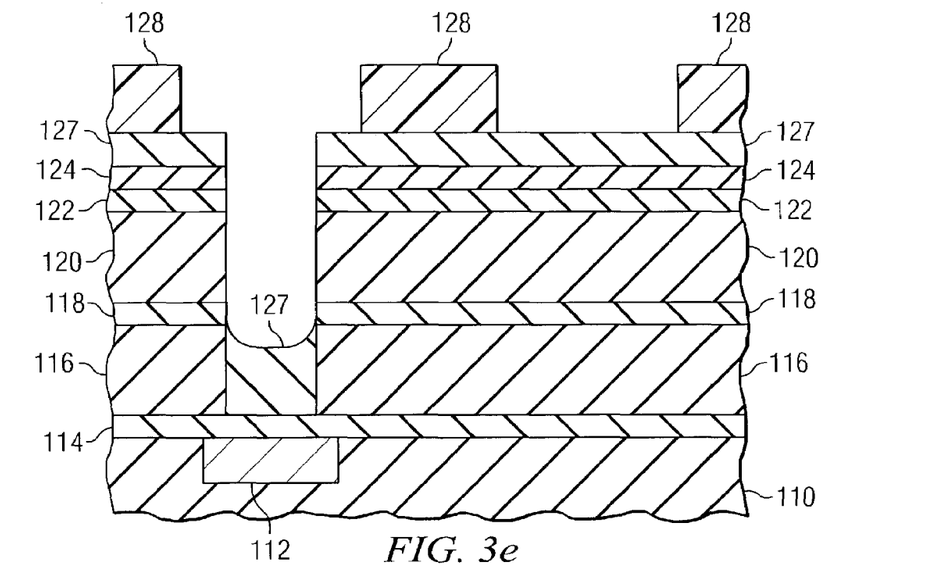
Figure 3F:
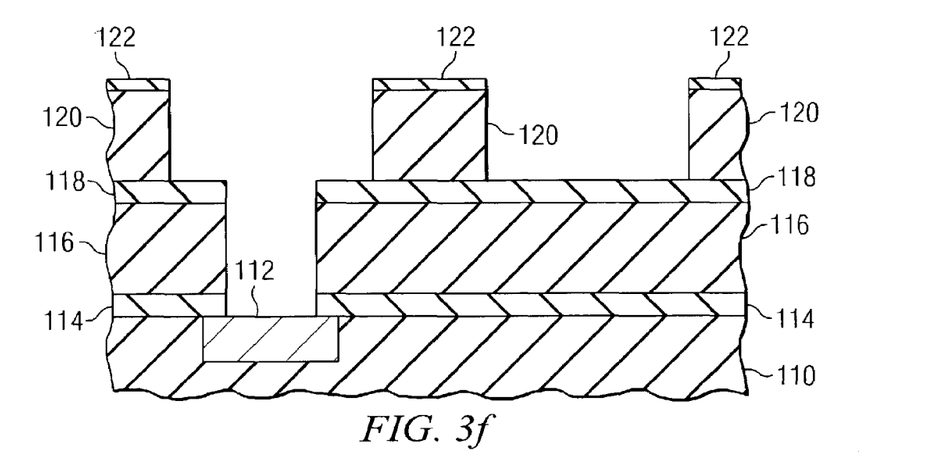

It has been observed, according to this invention, that the presence of the dual cap layer of nitride cap layer 122 and SiC cap layer 124 is beneficial for trench etch, particularly in guarding against increase of critical dimension in the trench etch process. However, it has also been observed, in some instances, that by maintaining SiC cap layer 124 after via etch and before trench etch, the effects of the outgassing of nitrogen-bearing contaminants from dielectric layers 116, 122 are exacerbated, resulting in a higher degree of resist poisoning. It is believed that, if it occurs, this increased resist poisoning is due to the channeling of the outgassing contaminants to the previously etched via, which of course corresponds to trench locations at which photoresist 126 is to be exposed and developed by chemical amplification. Accordingly, in the alternative, SiC cap layer 124 (and nitride cap layer 122, if desired) may be removed from the surface of intrametal dielectric layer 120 prior to trench photolithography.

In either case, following trench photolithography, intrametal dielectric layer 120 is etched (along with BARC layer 127 and remaining portions of cap layers 122, 124, if any, that are at the trench locations). This trench etch continues until trench etch-stop layer 118 is reached. Alternatively, especially if no trench etch-stop layer 118 is used, the trench etch may be a timed etch. An ash or wet cleanup, or both, may then be performed to remove photoresist and BARC residues. Via etch-stop layer 114 at the bottom of the previously etched via is then removed, resulting in the structure shown in FIG. 3f. As evident from this Figure, a portion of cap layers 122, 124 may remain after etch-stop layer 114 etch, or alternatively these cap layers 122, 124 may be fully removed.

Figure 3G:
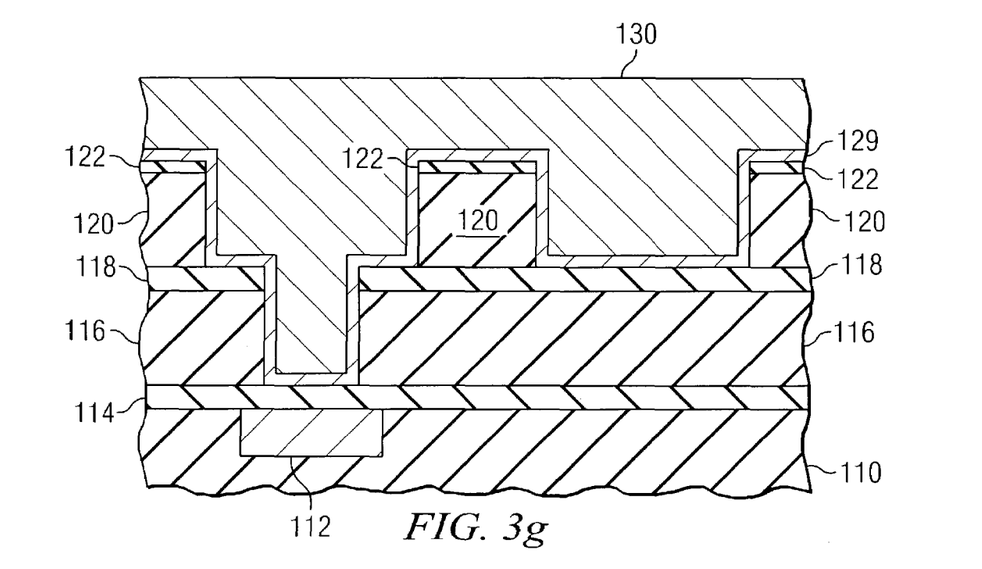
Figure 3H:
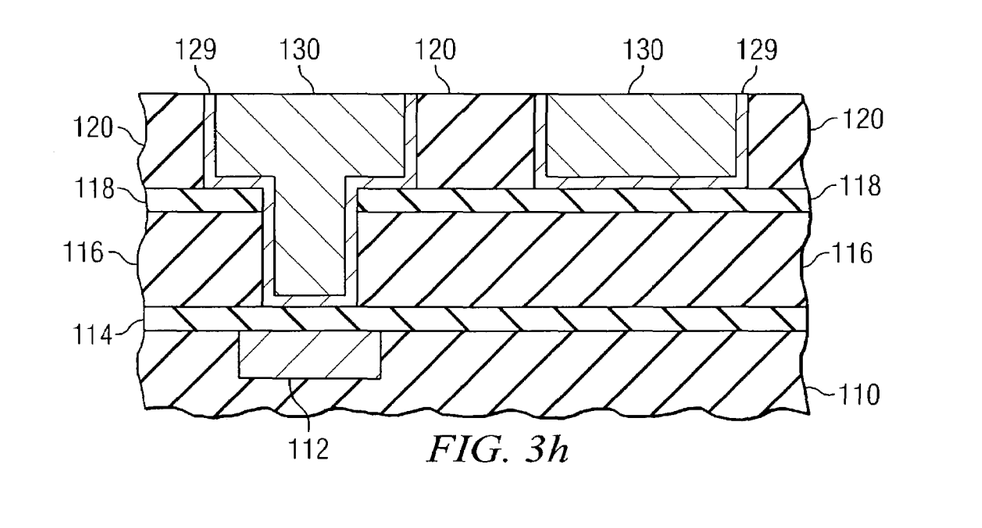

Copper metallization is then deposited overall, beginning with the deposition of liner layer 129 to serve as a diffusion barrier, followed by the deposition of a copper seed layer and the electroplating of copper layer 130, resulting in the structure of FIG. 3g. While this invention is also applicable to other metal materials that form damascene conductors, copper is of course the most common metal from which damascene metal conductors are formed in modern processes. CMP is then performed to planarize the electroplated copper to a level flush with the surrounding insulator, generally also removing remaining portions of layers 122, 124 to the extent still present, as shown in FIG. 3h. The dual damascene process can then be repeated for additional metal levels, in the same manner, to the extent required by the particular integrated circuit.

According to the preferred embodiments of the invention, the formation of vias in a damascene metallization process is greatly improved. These vias can be etched at minimum dimensions, fully to the limits of the photolithography process, without undesirable widening of the vias and thus eliminating the need to compensate for via widening by adjustment of the via pattern. This improved photolithographic accuracy is achieved, according to this invention, while also preventing failures due to resist poisoning.

While the present invention has been described according to its preferred embodiments, it is of course contemplated that modifications of, and alternatives to, these embodiments, such modifications and alternatives obtaining the advantages and benefits of this invention, will be apparent to those of ordinary skill in the art having reference to this specification and its drawings. It is contemplated that such modifications and alternatives are within the scope of this invention as subsequently claimed herein.

What is claimed is:

1. A method of forming a metal conductor in an integrated circuit, comprising the steps of:
   forming an etch-stop layer over a conductor near a surface of a substrate;
   depositing a dielectric layer over the etch-stop layer;
   then depositing a dual cap layer comprised of a layer comprised of silicon carbide and a layer comprised of silicon nitride over the dielectric layer;
   patterning a masking layer over the dual cap layer to define the location of an opening through the dielectric layer;
   etching the dual cap layer and the interlevel dielectric layer at the defined location to form an opening, exposing a portion of the etch-stop layer, wherein said etching step erodes said masking layer leaving a masking layer residue;
   after said etching step, removing said masking layer residue;
   then, etching the exposed portion of the etch-stop layer; and
   depositing metal into the opening to electrically contact the conductor.

2. The method of claim 1, wherein the opening is a via formed through the dielectric layer;
   and wherein the dielectric layer is an interlevel dielectric layer.

3. The method of claim 1, wherein the opening is a trench formed into the dielectric layer;
   and wherein the dielectric layer is an intermetal dielectric layer.

4. The method of claim 1, wherein the dual cap layer comprises the layer of silicon carbide underlying the layer of silicon nitride.

5. The method of claim 1, wherein the dual cap layer comprises the layer of silicon nitride underlying the layer of silicon carbide.

6. The method of claim 1, after the step of depositing a dual cap layer, depositing a thin layer of silicon dioxide over the dual cap layer.

7. The method of claim 1, wherein the step of patterning a masking layer comprises:
   depositing a bottom anti-reflective layer overall;
   dispensing a layer of photoresist over the bottom anti-reflective layer;

exposing selected locations of the layer of photoresist; and then developing the layer of photoresist to remove portions thereof at the defined location.

8. The method of claim 7, further comprising:

chemically amplifying the exposed layer of photoresist to transfer the exposure through the thickness of the layer of photoresist.

9. The method of claim 7, wherein the exposing step comprises exposing the layer of photoresist to light having a wavelength of about 193 nm.

10. The method of claim 1, wherein the metal comprises copper.

11. The method of claim 10, further comprising:

after the depositing step, planarizing the deposited copper by chemical-mechanical polishing to remove portions of the deposited copper from locations outside of the opening.

12. The method of claim 11, wherein the dielectric layer is an interlevel dielectric layer;

and further comprising:

after the planarizing step, depositing an intrametal dielectric layer overall;

etching selected locations of the intrametal dielectric layer to form trenches thereat, including at a location overlying the via;

depositing metal comprising copper into the trenches; and then planarizing the deposited copper by chemical-mechanical polishing to remove portions of the deposited copper from locations outside of the trenches.

13. The method of claim 12, wherein the intrametal dielectric layer comprises an organosilicate glass.

14. The method of claim 13, wherein the interlevel dielectric layer comprises an organosilicate glass.

15. The method of claim 13, wherein the interlevel dielectric layer comprises an ultra-low-k dielectric material.

16. The method of claim 1, wherein the dielectric layer comprises an organosilicate glass.

17. The method of claim 1, wherein the dielectric layer comprises an ultra-low-k dielectric material.

18. The method of claim 1, wherein the dielectric layer is an interlevel dielectric layer;

and further comprising:

after the step of depositing the interlevel dielectric layer, and before the step of then depositing the dual cap layer, depositing an intrametal dielectric layer;

wherein the step of etching the dual cap layer and the interlevel dielectric layer at the defined via location also etches through the intrametal dielectric layer at the defined via location.

19. The method of claim 18, further comprising:

after the step of depositing the interlevel dielectric layer, and before the step of depositing the intrametal dielectric layer, depositing a trench etch-stop layer.

20. The method of claim 18, further comprising:

before the step of depositing metal into the via, patterning a masking layer over the intrametal dielectric layer to define the location of a plurality of trenches into the intrametal dielectric layer, at least one of the plurality of trenches located at the location of the via through the interlevel dielectric layer; and etching the intrametal dielectric layer at the trench locations.

21. The method of claim 20, wherein the step of depositing metal into the via also deposits metal into the plurality of trenches.

22. The method of claim 20, further comprising:

after the step of etching the dual cap layer and the interlevel dielectric layer and before the step of patterning a masking layer over the intrametal dielectric layer, removing at least a portion of the dual cap layer.

23. The method of claim 22, wherein the step of depositing metal into the via also deposits metal into the plurality of trenches.

24. A method of forming a metal conductor in an integrated circuit, comprising the steps of:

forming an etch-stop layer over a conductor near a surface of a substrate;

depositing a dielectric layer over the etch-stop layer;

then depositing a dual cap layer comprised of a layer comprised of silicon carbide and a layer comprised of silicon nitride over the dielectric layer;

patterning a photoresist masking layer over the dual cap layer to define the location of an opening through the dielectric layer;

etching the dual cap layer and the interlevel dielectric layer at the defined location to form an opening, exposing a portion of the etch-stop layer, wherein said etching step erodes said photoresist masking layer leaving a photoresist residue;

after said etching step, removing said photoresist residue;

then, etching the exposed portion of the etch-stop layer; and depositing metal into the opening to electrically contact the conductor.

25. A method of forming a metal conductor in an integrated circuit, comprising the steps of:

forming an etch-stop layer over a conductor near a surface of a substrate;

depositing an interlevel dielectric layer over the etch-stop layer;

depositing an intrametal dielectric layer over the interlevel dielectric layer;

then depositing a dual cap layer comprised of a layer comprised of silicon carbide and a layer comprised of silicon nitride over the intrametal dielectric layer;

patterning a via photoresist masking layer over the dual cap layer to define the location of a via opening through the dielectric layer;

etching the dual cap layer, the intrametal dielectric layer and the interlevel dielectric layer at the defined location to form a via opening, exposing a portion of the etch-stop layer, wherein said etching step erodes said via photoresist masking layer leaving a photoresist residue;

after said etching step, removing said photoresist residue;

patterning a trench photoresist masking layer over the intrametal dielectric layer to define the location of a trench opening;

etching said intrametal dielectric layer to form a trench;

then, removing said trench photoresist masking layer;

then, etching the exposed portion of the etch-stop layer; and depositing metal into the opening to electrically contact the conductor.

* * * * *